United States Patent
Isobe et al.

(10) Patent No.: US 10,263,141 B2
(45) Date of Patent: Apr. 16, 2019

(54) SEMICONDUCTOR LIGHT-EMITTING DEVICE AND METHOD OF MANUFACTURING SEMICONDUCTOR LIGHT-EMITTING DEVICE

(71) Applicant: SONY CORPORATION, Tokyo (JP)

(72) Inventors: Yuuki Isobe, Miyagi (JP); Hidekazu Kawanishi, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/767,548

(22) PCT Filed: Sep. 26, 2016

(86) PCT No.: PCT/JP2016/078209
§ 371 (c)(1),
(2) Date: Apr. 11, 2018

(87) PCT Pub. No.: WO2017/081947
PCT Pub. Date: May 18, 2017

(65) Prior Publication Data
US 2018/0309020 A1   Oct. 25, 2018

(30) Foreign Application Priority Data

Nov. 12, 2015   (JP) .................. 2015-222020

(51) Int. Cl.
*H01L 33/06*   (2010.01)
*C23C 16/34*   (2006.01)
(Continued)

(52) U.S. Cl.
CPC ............. *H01L 33/06* (2013.01); *C23C 16/34* (2013.01); *H01L 21/205* (2013.01);
(Continued)

(58) Field of Classification Search
CPC ... H01L 33/06; H01L 33/0025; H01L 33/325; H01L 33/0075
See application file for complete search history.

(56) References Cited

U.S. PATENT DOCUMENTS

2009/0179191 A1 *   7/2009   Smith .................... B82Y 20/00
                                                       257/13
2010/0150194 A1   6/2010   Tsuchiya et al.
2011/0206081 A1   8/2011   Kasugai et al.

FOREIGN PATENT DOCUMENTS

JP   2001-068733 A   3/2001
JP   2003-289156 A   10/2003
(Continued)

OTHER PUBLICATIONS

International Search Report and Written Opinion issued in connection with International Patent Application No. PCT/JP2016/078209, dated Dec. 13, 2016. (9 pages).
(Continued)

*Primary Examiner* — Elias Ullah
(74) *Attorney, Agent, or Firm* — K&L Gates

(57) ABSTRACT

A semiconductor light-emitting device according to an embodiment of the present disclosure includes a nitride-based first light-emitting layer. The first light-emitting layer has an $In_aGa_{1-a}N$ layer (a≥0), and has a plurality of first island-shaped regions that include $In_bGa_{1-b}N$ (b>a) inside the $In_aGa_{1-a}N$ layer.

13 Claims, 10 Drawing Sheets

(51) Int. Cl.
*H01L 21/205* (2006.01)
*H01S 5/343* (2006.01)
*H01L 33/00* (2010.01)
*H01L 33/32* (2010.01)

(52) U.S. Cl.
CPC ...... *H01L 33/0025* (2013.01); *H01L 33/0075* (2013.01); *H01L 33/325* (2013.01); *H01S 5/343* (2013.01)

(56) References Cited

FOREIGN PATENT DOCUMENTS

| | | |
|---|---|---|
| JP | 2006-295219 A | 7/2006 |
| JP | 2007-200933 A | 8/2007 |
| JP | 2009-054616 A | 3/2009 |
| JP | 2010-141242 A | 6/2010 |
| JP | 2010-182977 A | 8/2010 |
| JP | 2011-171431 A | 9/2011 |
| WO | 2011/101929 A1 | 8/2011 |

OTHER PUBLICATIONS

Frost et al., Temperature-dependent measurement of Auger recombination in In0.40Ga0.60N/GaN red-emitting (k5630 nm) quantum dots, Applied Physics Letters 104, 081121 (2014).

\* cited by examiner

[ FIG. 1 ]
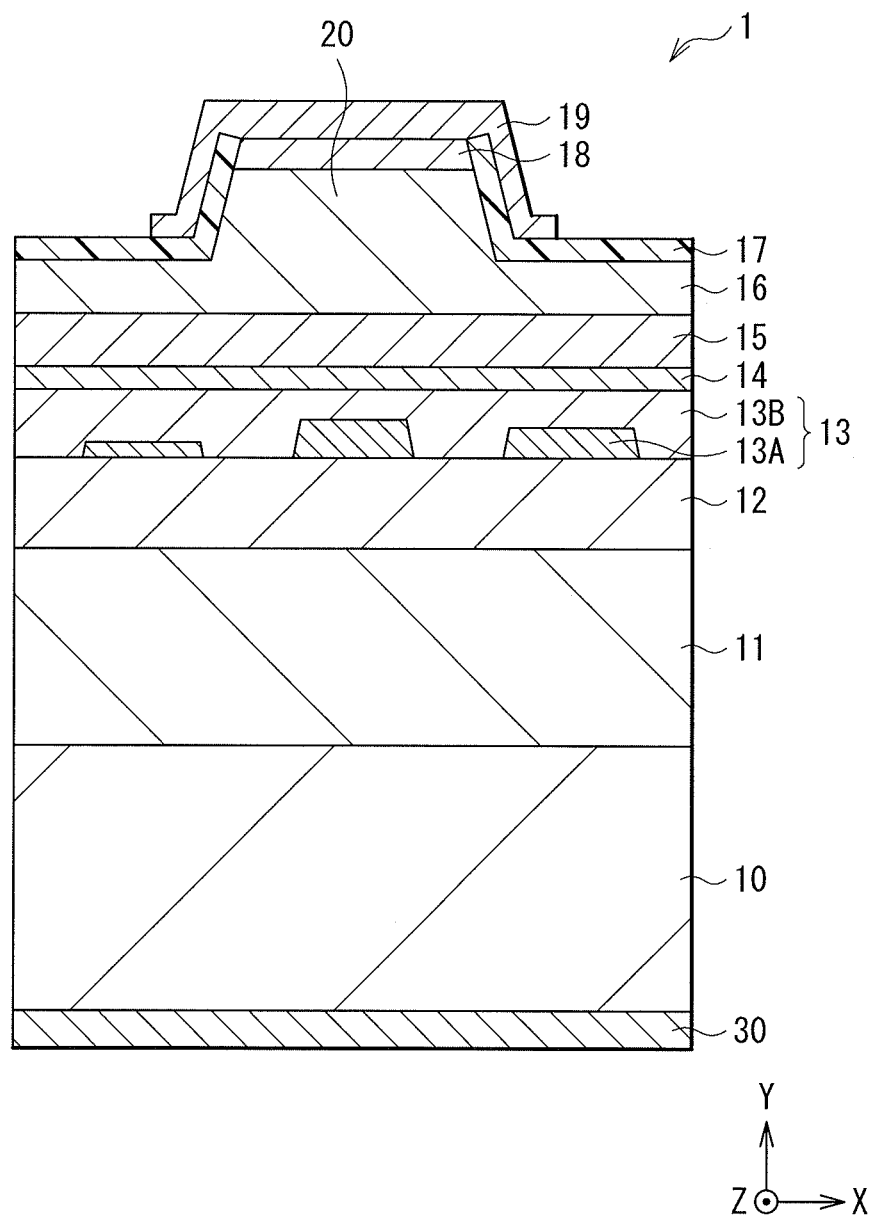

[ FIG. 2 ]
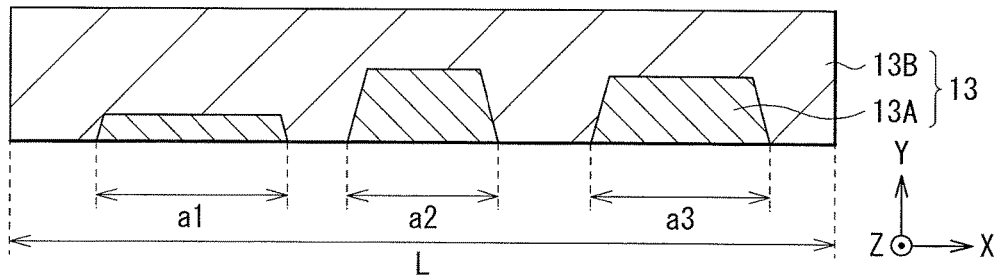
[ FIG. 3 ]
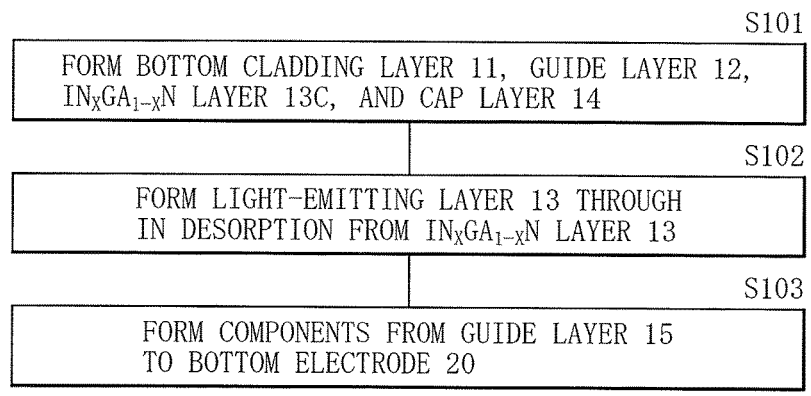
[ FIG. 4A ]
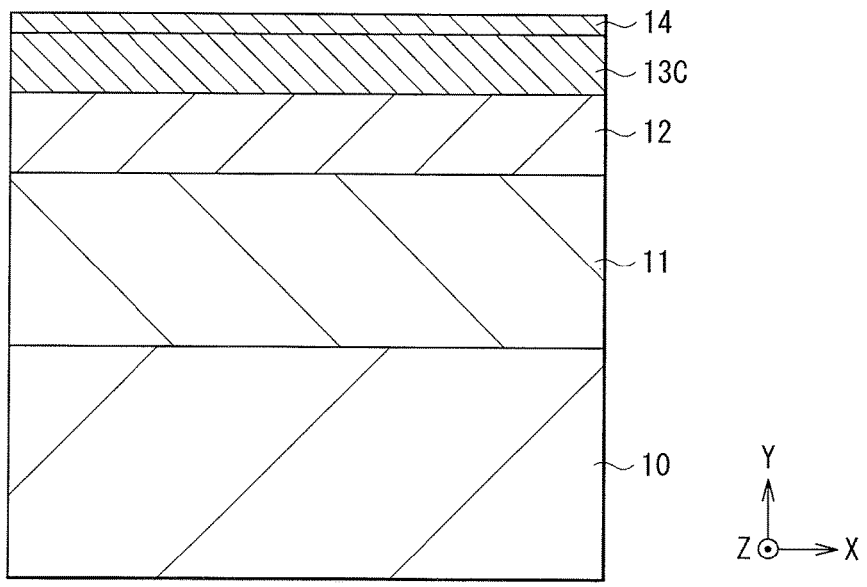

[ FIG. 4B ]
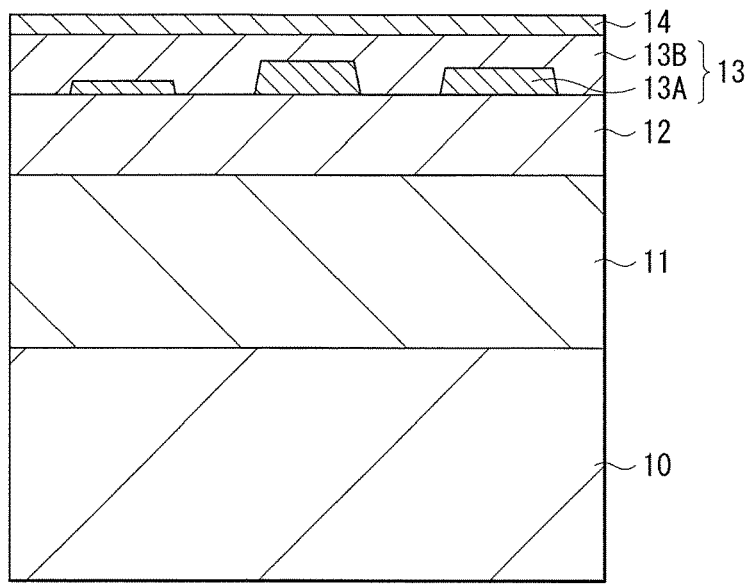
[ FIG. 4C ]
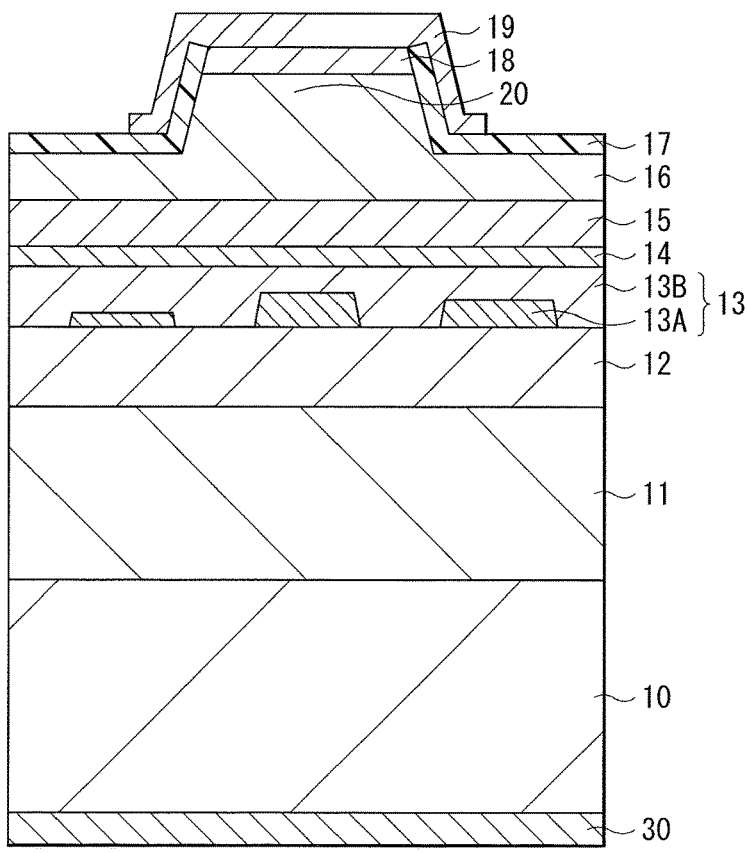

[ FIG. 5 ]
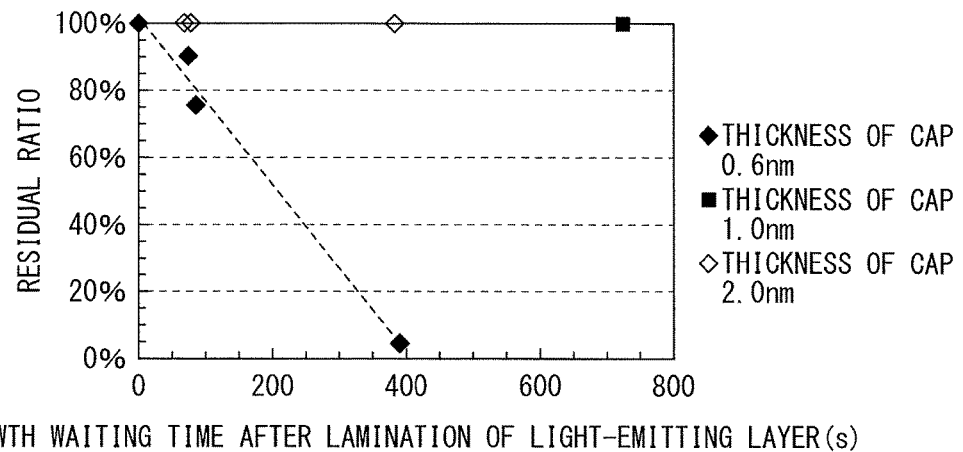
GROWTH WAITING TIME AFTER LAMINATION OF LIGHT-EMITTING LAYER(s)
[ FIG. 6 ]
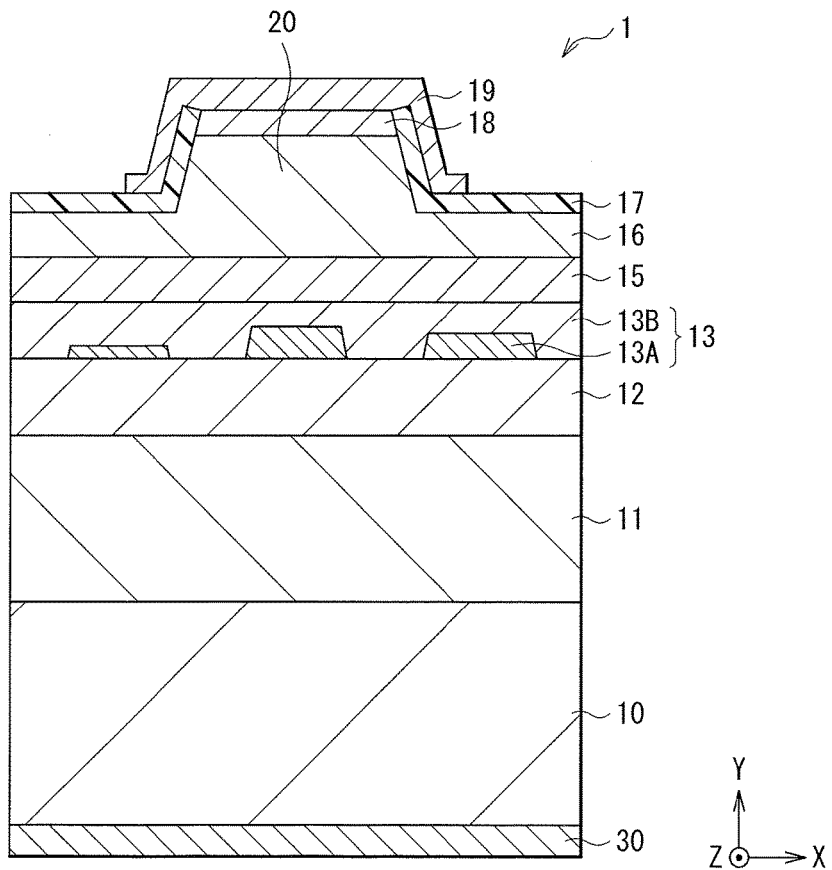

[ FIG. 7 ]
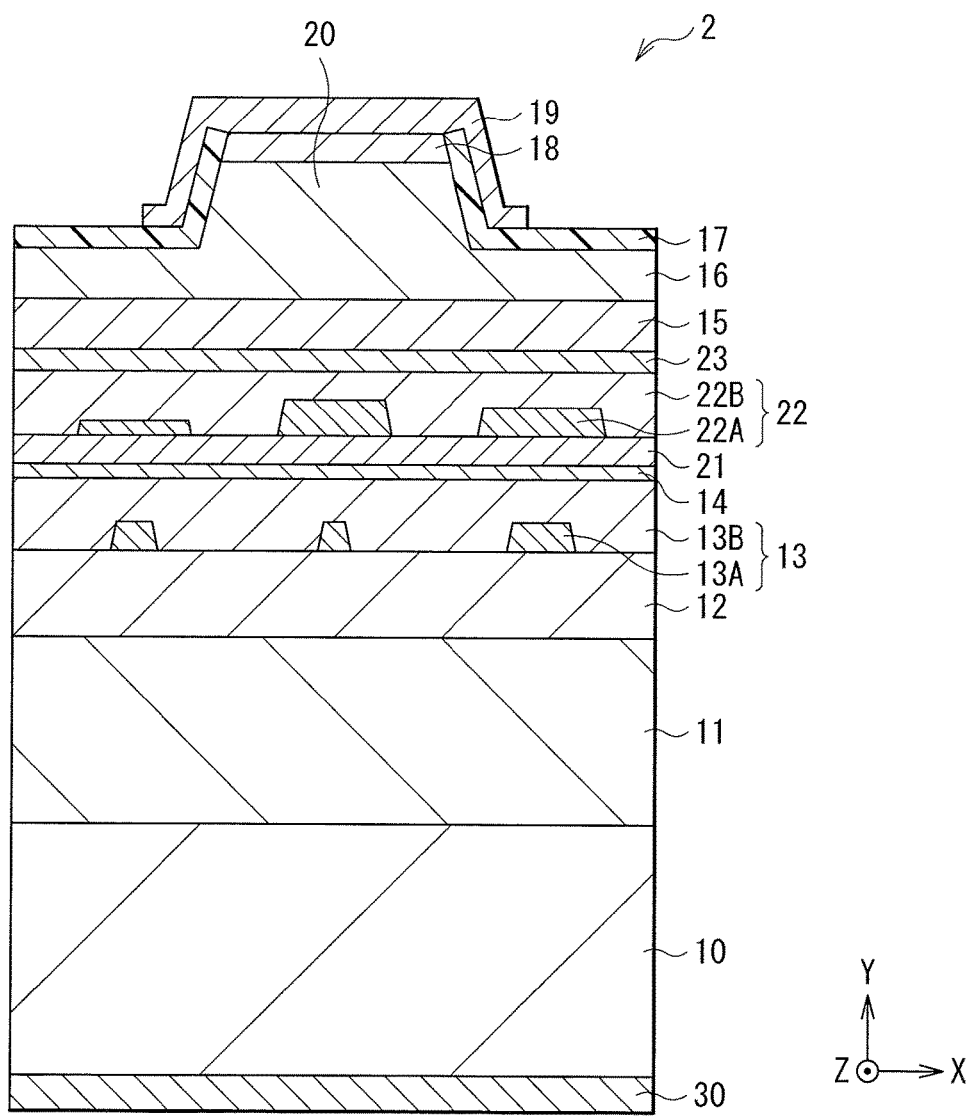

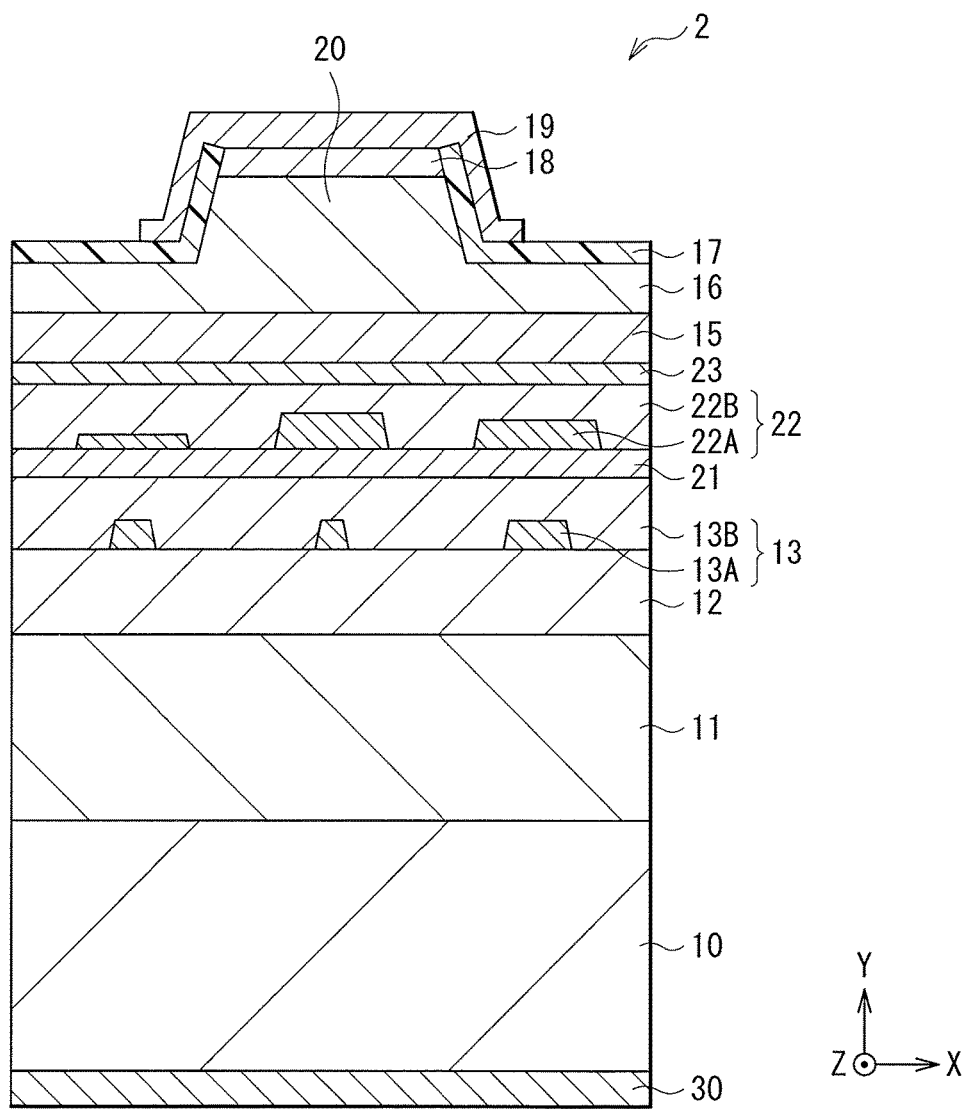
[ FIG. 8 ]

[ FIG. 9A ]
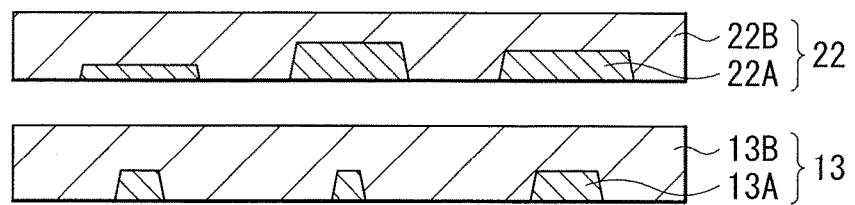
[ FIG. 9B ]
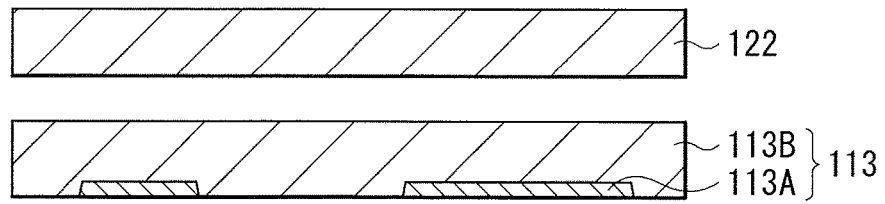
[ FIG. 9C ]
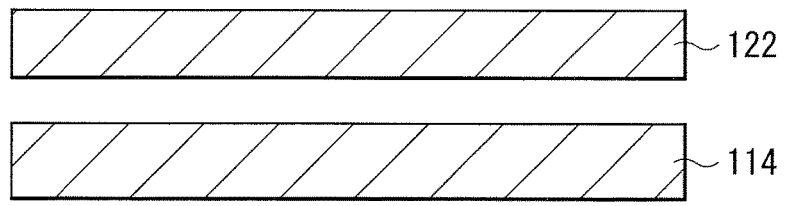

[ FIG. 10 ]
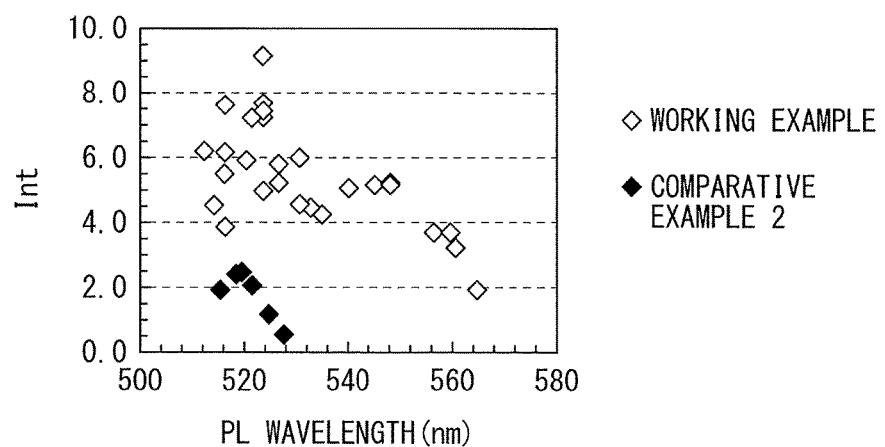
[ FIG. 11 ]
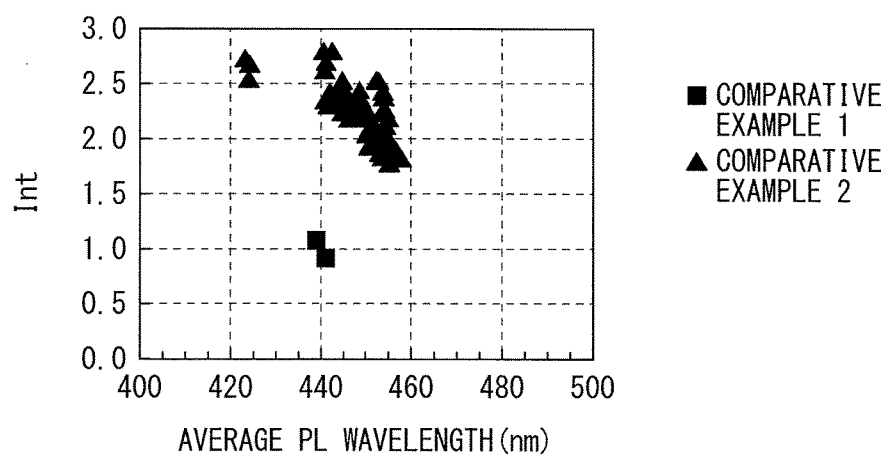

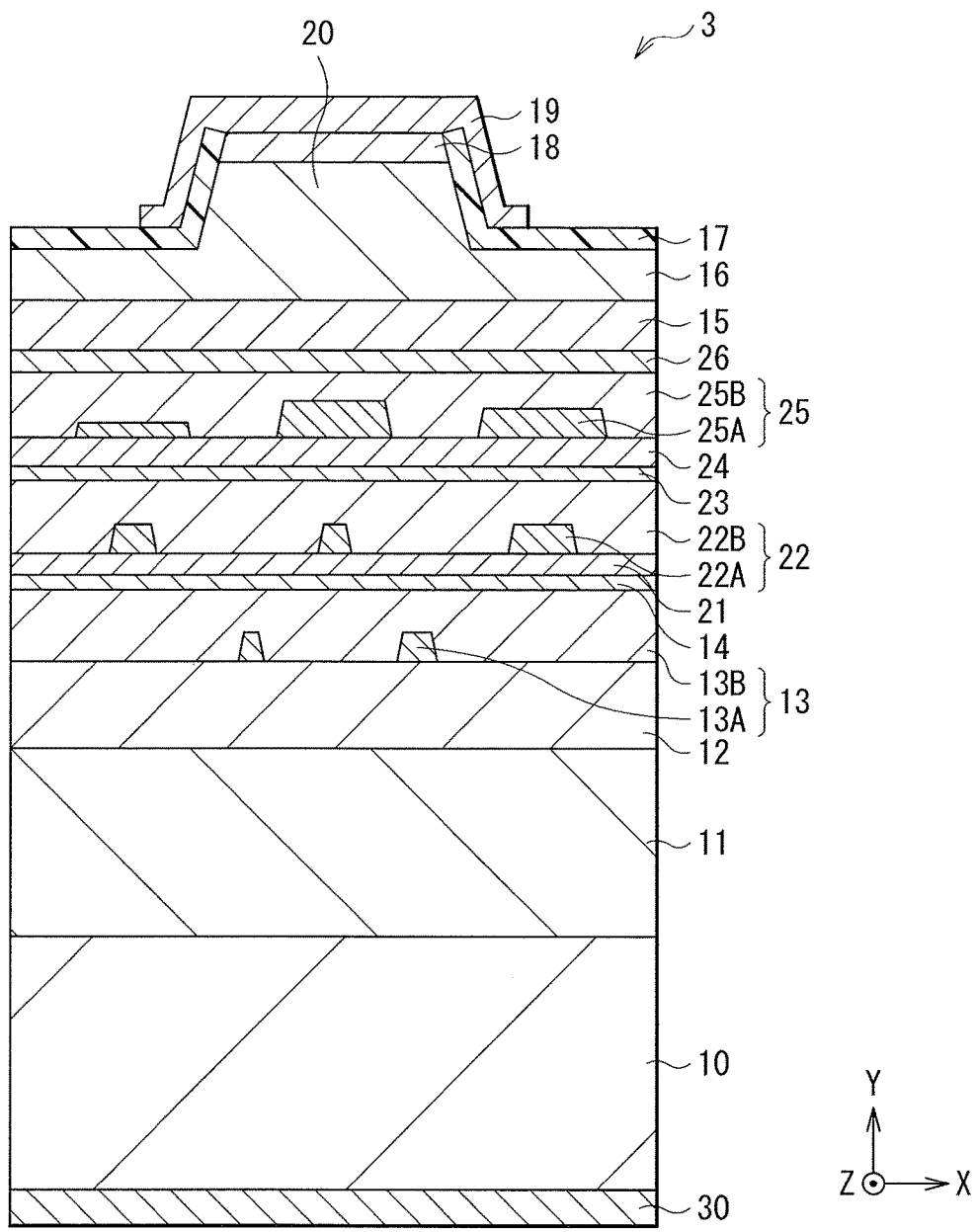
[ FIG. 12 ]

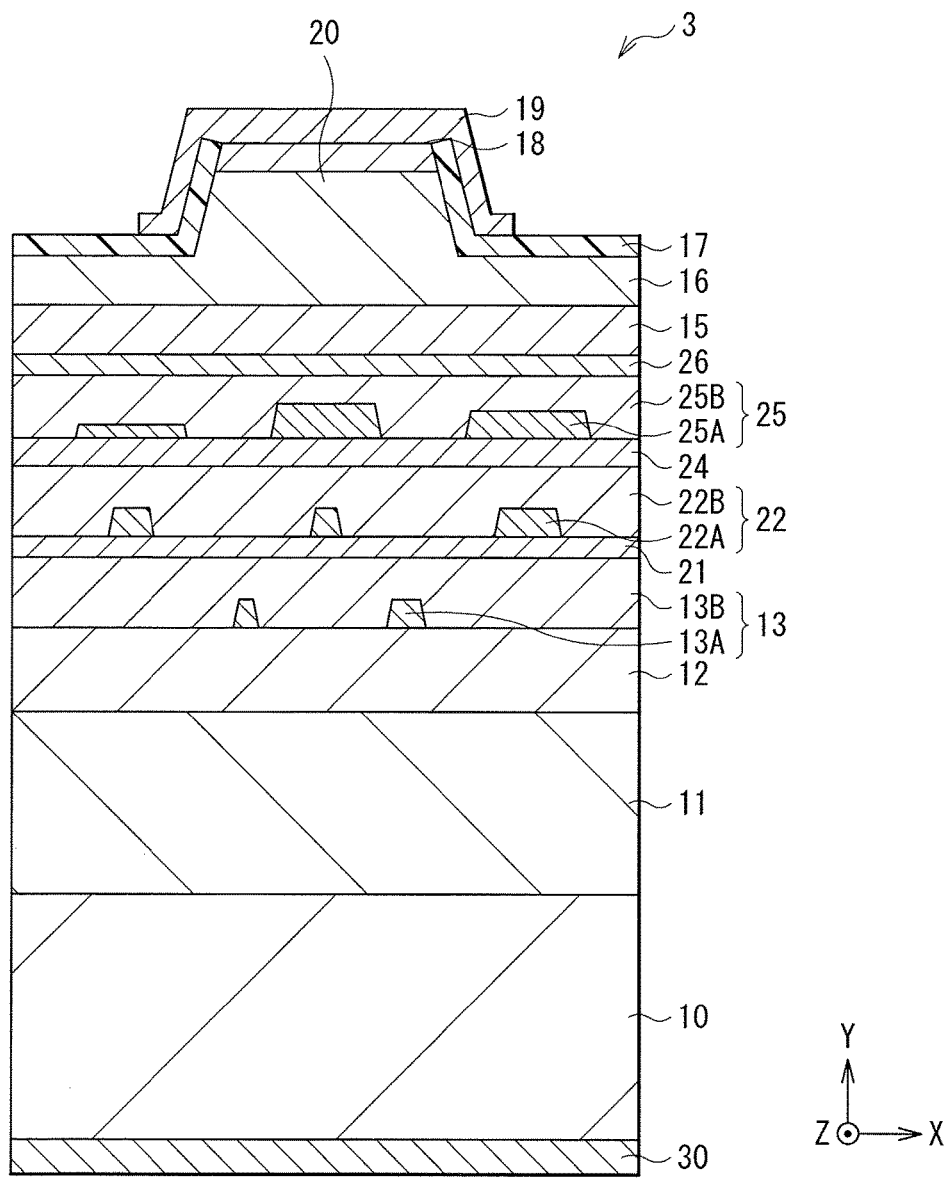
[ FIG. 13 ]

SEMICONDUCTOR LIGHT-EMITTING DEVICE AND METHOD OF MANUFACTURING SEMICONDUCTOR LIGHT-EMITTING DEVICE

CROSS REFERENCE TO RELATED APPLICATIONS

The present application claims the benefit of International Application No. PCT/JP2016/078209, filed Sep. 26, 2016, which claims priority to Japanese Application No. 2015-222020, filed Nov. 12, 2015, the disclosures of which are incorporated herein by reference.

BACKGROUND

The present disclosure relates to a nitride-based semiconductor light-emitting device, and to a method of manufacturing the same.

In recent years, as a semiconductor light-emitting device, for example, a light-emitting diode (Light Emitting Diode; LED) at a wavelength band ranging between blue and green colors that is used for general lighting, and a semiconductor laser (Laser Diode; LD) at a green wavelength band that is used for a laser display, a pointer, etc. have been developed. These semiconductor light-emitting devices use nitride-based compound semiconductors. A nitride-based semiconductor light-emitting device typically includes an active layer having an AlInGaN-based quantum well structure, and makes it possible to achieve emission of light at the green wavelength band by increasing a composition ratio of In in the active layer.

In contrast, in a case of an increase in the composition ratio of the In in the active layer, an issue of deterioration in light-emitting efficiency will occur due to an increased difference in a lattice constant between the active layer and a foundation layer, an increased lattice distortion of a crystal in association with such an increased difference, and degradation in crystalline property such as proliferation of crystal defects or dislocation, etc.

As a method of resolving such an issue, a semiconductor laser is disclosed that utilizes a new quantum structure in which the active layer includes quantum dots (for example, see NPTL 1 and PTLs 1 to 3). The active layer with use of the quantum dots achieves a small absolute amount of the lattice distortion, allowing for suppression of crystal deterioration caused by the lattice distortion. Further, the active layer with use of the quantum dots reduces extra charges that make no contribution to laser oscillation, making it possible to generate an optical gain efficiently.

SUMMARY

However, the quantum dot structure has raised issues of difficulties in high-volume production and stable manufacturing.

Accordingly, it is desirable to provide a semiconductor light-emitting device, and a method of manufacturing a semiconductor light-emitting device that allow for simplified and stable manufacturing, and improvement in light-emitting efficiency.

A semiconductor light-emitting device according to an embodiment of the present disclosure includes a nitride-based first light-emitting layer. The first light-emitting layer has an $In_aGa_{1-a}N$ layer ($a \geq 0$), and has a plurality of first island-shaped regions that include $In_bGa_{1-b}N$ ($b > a$) inside the $In_aGa_{1-a}N$ layer.

In the semiconductor light-emitting device according to the embodiment of the present disclosure, the plurality of first island-shaped regions including $In_bGa_{1-b}N$ are formed inside the $In_aGa_{1-a}N$ layer that determines an outline of the first light-emitting layer. This allows for reduction in lattice distortion of the first light-emitting layer. It is possible to form the first light-emitting layer with such a configuration through In desorption from an $In_xGa_{1-x}N$ layer ($x > 0$). The In desorption from the $In_xGa_{1-x}N$ layer is achievable by exposing the $In_xGa_{1-x}N$ layer under a high-temperature condition, for example. A degree or velocity of the In desorption from the $In_xGa_{1-x}N$ layer is controllable by adjusting, for example, temperature, a thickness of a cap layer to be provided on a front surface of the $In_xGa_{1-x}N$ layer, a type of gas promoting the In desorption, etc. as appropriate. It is to be noted that the cap layer may be omitted. In such a manner, it is possible to form the plurality of first island-shaped regions with use of an easy-to-control In desorption method. Further, use of a metal-organic chemical vapor deposition (MOCVD) method suitable for the high-volume production makes it possible to form the $In_xGa_{1-x}N$ layer and the cap layer.

A method of manufacturing a semiconductor light-emitting device according to an embodiment of the present disclosure includes forming, through In desorption from an $In_xGa_{1-x}N$ layer ($x > 0$), a nitride-based first light-emitting layer having an $In_aGa_{1-a}N$ layer ($a \geq 0$) and having a plurality of first island-shaped regions that include $In_bGa_{1-b}N$ ($b > a$) inside the $In_aGa_{1-a}N$ layer.

In the method of manufacturing the semiconductor light-emitting device according to the embodiment of the present disclosure, the plurality of first island-shaped regions are formed through In desorption from the $In_xGa_{1-x}N$ layer ($x > 0$). This allows for reduction in lattice distortion of the first light-emitting layer. The In desorption from the $In_xGa_{1-x}N$ layer is achievable by exposing the $In_xGa_{1-x}N$ layer under a high-temperature condition, for example. A degree or velocity of the In desorption from the $In_xGa_{1-x}N$ layer is controllable by adjusting, for example, temperature, a thickness of a cap layer to be provided on a front surface of the $In_xGa_{1-x}N$ layer, a type of gas promoting the In desorption, etc. as appropriate. It is to be noted that the cap layer may be omitted. In such a manner, the plurality of first island-shaped regions are formed with use of an easy-to-control In desorption method. Further, use of the metal-organic chemical vapor deposition (MOCVD) method suitable for the high-volume production makes it possible to form the $In_xGa_{1-x}N$ layer and the cap layer.

According to the semiconductor light-emitting device of the embodiment of the present disclosure, the plurality of first island-shaped regions including the $In_bGa_{1-b}N$ are formed inside the $In_aGa_{1-a}N$ layer that determines the outline of the first light-emitting layer. This makes it possible to simply and stably manufacture the semiconductor light-emitting device that allows for improvement in light-emitting efficiency.

According to the method of manufacturing the semiconductor light-emitting device of the embodiment of the present disclosure, the plurality of first island-shaped regions are formed through the In desorption from the $In_xGa_{1-x}N$ layer. This makes it possible to simply and stably manufacture the semiconductor light-emitting device that allows for improvement in light-emitting efficiency.

It is to be noted that the effects of the present disclosure are not limited to the effects described above, and may be other effects, or may further include other effects.

BRIEF DESCRIPTION OF DRAWINGS

FIG. 1 is a cross-sectional view of an example of a configuration of a semiconductor light-emitting device according to a first embodiment of the present disclosure.

FIG. 2 is a cross-sectional schematic view of a configuration of a light-emitting layer illustrated in FIG. 1.

FIG. 3 is a flow chart illustrating a method of forming the light-emitting layer illustrated in FIG. 1.

FIG. 4A is a cross-sectional view for explaining the method of forming the light-emitting layer illustrated in FIG. 3.

FIG. 4B is a cross-sectional view following FIG. 4A.

FIG. 4C is a cross-sectional view following FIG. 4B.

FIG. 5 is a characteristic diagram illustrating a relationship between a waiting time after lamination of a light-emitting layer and a residual ratio of an $In_bGa_{1-b}N$ layer.

FIG. 6 is a cross-sectional view of another example of the configuration of the semiconductor light-emitting device according to the first embodiment of the present disclosure.

FIG. 7 is a cross-sectional view of an example of a configuration of a semiconductor light-emitting device according to a second embodiment of the present disclosure.

FIG. 8 is a cross-sectional view of another example of the configuration of the semiconductor light-emitting device according to the second embodiment of the present disclosure.

FIG. 9A is a cross-sectional schematic view of configurations of two light-emitting layers illustrated in FIGS. 7 and 8.

FIG. 9B is a cross-sectional schematic view of configurations of two light-emitting layers according to a first comparative example.

FIG. 9C is a cross-sectional schematic view of configurations of two light-emitting layers according to a second comparative example.

FIG. 10 is a characteristic diagram comparing PL wavelengths and emission intensity values in a semiconductor light-emitting device having configurations of the light-emitting layers illustrated in FIG. 9A (a working example) and a semiconductor light-emitting device having configurations of the light-emitting layers illustrated in FIG. 9C (the comparative example 2).

FIG. 11 is a characteristic diagram comparing PL wavelengths and emission intensity values in a semiconductor light-emitting device having configurations of the light-emitting layers illustrated in FIG. 9B (the comparative example 1) and the semiconductor light-emitting device having configurations of the light-emitting layers illustrated in FIG. 9C (the comparative example 2).

FIG. 12 is a cross-sectional view of another example of the configuration of the semiconductor light-emitting device according to the second embodiment of the present disclosure.

FIG. 13 is a cross-sectional view of another example of the configuration of the semiconductor light-emitting device according to the second embodiment of the present disclosure.

DETAILED DESCRIPTION

Hereinafter, embodiments of the present disclosure are described in detail with reference to the drawings. It is to be noted that description is given in the following order.
1. First Embodiment (an example of having a plurality of island-shaped light-emitting regions inside a light-emitting layer)
 1-1. Overall Configuration
 1-2. Manufacturing Method
 1-3. Workings and Effects
2. Second Embodiment (an example of having a plurality of light-emitting layers)

[1. First Embodiment]

FIG. 1 illustrates an example of a configuration of a semiconductor light-emitting device (a semiconductor laser 1) according to a first embodiment of the present disclosure. The semiconductor laser 1 is, for example, an edge-emitting semiconductor laser. The semiconductor laser 1 is, for example, a nitride-based semiconductor laser that oscillates a laser beam at a green wavelength band, and is used in, for example, a laser display, a pointer, etc. It is to be noted that FIG. 1 schematically illustrates a configuration of the semiconductor laser 1, and illustrated dimensions and shape thereof are different from actual ones.

(1-1. Overall Configuration)

The semiconductor laser 1 has a semiconductor layer on a substrate 10. The semiconductor layer on the substrate 10 has a configuration in which, for example, a bottom cladding layer 11, a guide layer 12, a light-emitting layer 13, a cap layer 14, a guide layer 15, a top cladding layer 16, and a contact layer 18 are laminated in this order from the substrate 10 side. The semiconductor laser 1 has a top electrode 19 on the contact layer 18, and a bottom electrode 30 on a rear surface of the substrate 10 (on a surface on the opposite side of a surface where the above-described semiconductor layer is formed).

The substrate 10 is, for example, an n-type GaN (gallium nitride) substrate. The substrate 10 has, for example, a buffer layer, a foundation layer, etc. on a front surface on the above-described semiconductor layer side.

The semiconductor layer on the substrate 10 includes a nitride semiconductor. Examples of the nitride semiconductor include GaN, AlGaN, InGaN, AlInGaN, etc. The nitride semiconductor may contain a boron (B) atom, a thallium (Tl) atom, an arsenic (As) atom, a phosphorous (P) atom, or an antimony (Sb) atom on an as-needed basis.

The bottom cladding layer 11 includes, for example, n-type AlGaN, and the guide layer 12 includes, for example, undoped InGaN.

The light-emitting layer 13 has an $In_aGa_{1-a}N$ layer 13B (a≥0), and a plurality of island-shaped regions 13A including $In_bGa_{1-b}N$ (b>a) inside the $In_aGa_{1-a}N$ layer 13B. In other words, the light-emitting layer 13 has, in its layer, a plurality of regions (the plurality of island-shaped regions 13A and the $In_aGa_{1-a}N$ layer 13B) that are different from one another in In concentration. Each of the island-shaped regions 13A is relatively higher in the In concentration as compared with the $In_aGa_{1-a}N$ layer 13B. The $In_aGa_{1-a}N$ layer 13B is relatively lower in the In concentration as compared with each of the island-shaped regions 13A.

Each of a bottom surface and a top surface of the light-emitting layer 13 takes a convexo-concave shape in conformity to a convexo-concave shape of each of top surfaces of the bottom cladding layer 11 and the guide layer 12, for example. Typically, the top surfaces of the bottom cladding layer 11 and the guide layer 12 are flat surfaces, and accordingly the bottom surface and the top surface of the light-emitting layer 13 are also flat surfaces. In other words, both of the bottom surface and the top surface of the $In_aGa_{1-a}N$ layer 13B are flat surfaces, and do not take the shape in conformity to the convexo-concave shape formed by the plurality of island-shaped regions 13A. Each of the island-shaped regions 13A is provided in an island-shaped manner at the bottom (here, on the guide layer 12 side) of the light-emitting layer 13, and a region extending from side surfaces to a top surface of each of the island-shaped regions 13A is covered with the $In_aGa_{1-a}N$ layer 13B. Therefore, the $In_aGa_{1-a}N$ layer 13B determines an outline of the light-emitting layer 13, and the plurality of island-shaped regions 13A are formed inside the $In_aGa_{1-a}N$ layer 13B that determines the outline of the light-emitting layer 13. As described in detail later, it is possible to form the light-emitting layer 13 with such a configuration through In desorption from an $In_xGa_{1-x}N$ layer 13C (x>0). Alternatively, it is possible to manufacture the light-emitting layer 13 with such a configuration by partially performing follow-up vapor deposition of the $In_xGa_{1-x}N$ layer 13C (x>0), or by performing diffusion of the In after the growth of layers above the cap layer 14 to be described later.

In the present embodiment, a plurality of first regions 13a with a higher In concentration are formed inside the light-emitting layer 13 in an island-shaped manner, which reduces lattice distortion of crystals as compared with a case of only a layered configuration. It is to be noted that it is also possible to form the island-shaped regions 13A, for example, at an intermediate or upper part of the light-emitting layer 13 with the exception of a bottom part of the light-emitting layer 13 depending on a manufacturing process. It is to be noted that the light-emitting layer 13 may include other additive elements of In, Ga, and N. Examples of the additive elements include aluminum (Al), boron (B), and thallium (Tl).

Here, a residual ratio (R) of the plurality of island-shaped regions 13A in the light-emitting layer 13 is 80% or less. As a result of the In desorption from the $In_xGa_{1-x}N$ layer 13C, the residual ratio (R) becomes 80% or less, leading to formation of the plurality of island-shaped regions 13A. As illustrated in FIG. 2, in a case where a width of the light-emitting layer 13 in an X-axis direction is L, and widths of the respective island-shaped regions 13A inside the light-emitting layer 13 in the X-axis direction are $a_1$, $a_2$, $a_3$, ..., the residual ratio (R) is a value obtained by dividing a sum of the widths of the respective island-shaped regions 13A ($a_1+a_2+a_3$ ...) by the width (L) of the light-emitting layer 13. It is to be noted that these values may be average values within the measurement range of a TEM, etc. (for example, within the range of about 0.1 μm to about 10 μm). The respective island-shaped regions 13A in the light-emitting layer 13 are identified by clearly bright locations (white spots) in a transmission electron microscope (Transmission Electron Microscope; TEM) photograph (a black-and-white image). Further, sizes of the respective island-shaped regions 13A are different depending on a manufacturing condition; however, widths of the respective island-shaped regions 13A (for example, $a_1$, $a_2$, and $a_3$) are within the range of 1 nm to 250 nm, and are preferably within the range of 3 nm to 200 nm.

The cap layer 14 includes, for example, undoped or p-type AlGaN that is represented by $Al_gIn_hGa_{1-(g+h)}N$ (g≥0, h≥0), and adjusts the In desorption from the $In_xGa_{1-x}N$ layer 13C during a waiting time in a manufacturing process. A film thickness (hereinafter simply referred to as a thickness) of the cap layer 14 in a lamination direction may be, for example, 2 nm or less, and is preferably, for example, from 0.1 nm to 1 nm both inclusive in consideration of manufacturing efficiency and easy control of the In desorption.

The guide layer 15 includes, for example, undoped InGaN or GaN, and the top cladding layer 16 includes, for example, p-type AlGaN.

The contact layer 18 includes, for example, p-type GaN, as with the guide layer 15 and the top cladding layer 16.

A portion of the top cladding layer 16, and the contact layer 18 form a narrow striped protruding portion (a ridge) 20 that extends in a direction of a resonator for the purpose of current constriction. A current constriction layer 17 including, for example, $SiO_2$ is formed on the top cladding layer 16, and side surfaces of the top cladding layer 16 and side surfaces of the contact layer 18 that configure the protruding portion 20. The top electrode 19 is provided on the contact layer 18, and is electrically coupled to the top cladding layer 16 through the contact layer 18.

The top electrode 19 includes a metal. An example of the top electrode 19 includes a multi-layer film (Pd/Pt/Au) in which, for example, palladium (Pd), platinum (Pt), and gold (Au) are laminated in this order from the contact layer 18 side. The top electrode 19 extends in a strip-like shape to perform current constriction, and a region that corresponds to the top electrode 19 of the light-emitting layer 13 serves as a light-emitting region.

The bottom electrode 30 includes a metal. An example of the bottom electrode 30 includes a multi-layer film (Ti/Pt/Au) in which, for example, Ti, Pt, and Au are laminated in this order from the substrate 10 side. The bottom electrode 30 may be electrically coupled to the bottom cladding layer 11 through the substrate 10, etc., and may not be formed on a rear surface of the substrate 10.

(1-2. Manufacturing Method)

It is possible to manufacture the semiconductor laser 1 as illustrated in FIG. 3, for example. First, the substrate 10 that includes, for example, GaN is prepared inside a reactor. Next, the bottom cladding layer 11, the guide layer 12, the $In_xGa_{1-x}N$ layer 13C, and the cap layer 14 are formed in this order on a top surface (a crystal growth surface) of the substrate 10 using, for example, an MOCVD (Metal-Organic Chemical Vapor Deposition) method (step S101, FIG. 4A). At this time, for growth temperature of each of the above layers, for example, the temperature is set at 1100° C. for the bottom cladding layer 11, 800° C. for the guide layer 12, and 750° C. for the $In_xGa_{1-x}N$ layer 13C and the cap layer 14. It is to be noted that the cap layer 14 has a thickness ensuring that the residual ratio of the plurality of island-shaped regions 13A in the light-emitting layer 13 is 80% or less by waiting for a predetermined time period to be described later.

It is to be noted that, in carrying out the MOCVD, for example, trimethylgallium $((CH_3)_3Ga)$ is used as a source gas for gallium; for example, trimethylaluminum $((CH_3)_3Al)$ is used as a source gas for aluminum; and for example, trimethylindium $((CH_3)_3In)$ is used as a source gas for indium. Further, for example, ammonia $(NH_3)$ is used as a source gas for nitrogen. In addition, for example, monosilane $(SiH_4)$ is used as a source gas for silicon, and, for example, bis-cyclopentadienyl magnesium $((C_5H_5)_2Mg)$ is used as a source gas for magnesium.

Next, temperature inside the reactor is raised up to the growth temperature of the guide layer 15. At this time, the temperature inside the reactor may be raised consecutively until the temperature reaches the growth temperature (for example, 800° C.) of the guide layer 15, or may be raised until the temperature reaches the growth temperature of the guide layer 15 after the temperature inside the reactor is maintained during a predetermined time period. After the cap layer 14 is formed, by waiting under a high-temperature condition for a predetermined time period in a duration until starting the growth of the guide layer 15, In is desorbed from the $In_xGa_{1-x}N$ layer 13C through the cap layer 14. The light-emitting layer 13 is formed through the In desorption from the $In_xGa_{1-x}N$ layer 13C (step S102, FIG. 4B). At this time, nitrogen gas may be injected into the reactor; however, the gas promoting the In desorption from the $In_xGa_{1-x}N$ layer 13C (for example, $NH_3$ (ammonia) gas or $H_2$ (hydrogen) gas) may be injected instead of the nitrogen gas. In a case where the $NH_3$ gas is injected into the reactor, $H_2$ gas is generated by thermal decomposition of $NH_3$. The $H_2$ gas has a property of easily bonding with In. Therefore, it is possible to achieve the In desorption from the $In_xGa_{1-x}N$ layer 13C through the cap layer 14 by injecting the $NH_3$ gas or the $H_2$ gas into the reactor in a waiting state. As described above, in the present embodiment, it is possible to simply form the plurality of island-shaped regions 13A utilizing In desorption without going through complicated processes such as an etching process, etc.

FIG. 5 illustrates a relationship between a waiting time after formation of the cap layer 14 and the residual ratio (R) of the $In_bGa_{1-b}N$ layer with a high In concentration in the light-emitting layer 13. FIG. 5 illustrates respective results in cases where thickness of the cap layer 14 is 0.6 nm, 1.0 nm, and 2.0 nm. As seen from FIG. 5, In desorption from the light-emitting layer 13 is more likely to take place by reducing the thickness of the cap layer 14. From the viewpoint of manufacturing efficiency, the thickness of the cap layer 14 is preferably 1 nm or less, and the residual ratio (R) of the first region 13a in the light-emitting layer 13 is controllable in a short time by specifying the thickness at about 0.6 nm.

It is to be noted that the cap layer 14 is not necessarily provided. Adjusting a waiting time, temperature during a waiting time period, gas present inside the reactor during the waiting time period, etc. makes it possible to form the plurality of island-shaped regions 13A without providing the cap layer 14. In such a case, for example, as illustrated in FIG. 6, the semiconductor laser 1 has a configuration of the semiconductor layer illustrated in FIG. 1 without the cap layer 14. Further, in a case where the cap layer 14 is formed, the cap layer 14 is not necessarily formed on a layer, and may be formed in an island shape, for example.

Next, the guide layer 15, the top cladding layer 16, the current constriction layer 17, the contact layer 18, and the top electrode 19 are formed on the cap layer 14, and thereafter the bottom electrode 30 is formed on the rear surface of the substrate 10 (step S103, FIG. 1). In a case where the cap layer 14 is omitted, the guide layer 15, the top cladding layer 16, the current constriction layer 17, the contact layer 18, and the top electrode 19 are formed on the light-emitting layer 13, and thereafter the bottom electrode 30 is formed on the rear surface of the substrate 10.

Specifically, the guide layer 15 and the top cladding layer 16 are formed using, for example, the MOCVD method. At this time, the growth temperature is specified as 1000° C., for example. Subsequently, after the contact layer 18 is formed using the MOCVD method, for example, an unillustrated mask is formed on the contact layer 18, and a portion of the contact layer 18 and a portion of the top cladding layer 16 are selectively removed by the use of, for example, an RIE (Reactive Ion Etching) method utilizing the mask. In such a manner, an upper part of the top cladding layer 16 and the contact layer 18 form the narrow striped protruding portion (the ridge) 20.

Next, the current constriction layer 17 that includes the above-described material is formed on the top cladding layer 16 and the contact layer 18, and an opening corresponding to a top surface of the protruding portion 20 is provided on the current constriction layer 17. Subsequently, the above-described metallic material is formed as a film using, for example, a vapor deposition method, a sputtering method, etc., and thereafter the top electrode 19 is formed by patterning the metallic material in a desired shape through etching with use of, for example, a photolithography method. Afterward, the rear surface side of the substrate 10 is subjected to, for example, wrapping and polishing to form the substrate 10 with a predetermined thickness, and thereafter the bottom electrode 30 is formed on the rear surface of the substrate 10. Lastly, a pair of edge surfaces of a resonator is formed through cleavage, and thereafter dicing of the edge surfaces is performed. Thus, the semiconductor laser 1 of the present embodiment is completed.

In the semiconductor laser 1 of the present embodiment, in a case where a predetermined voltage is applied across the top electrode 19 and the bottom electrode 30, a current is injected into the light-emitting layer 13, resulting in generation of light emission particularly in the respective island-shaped regions 13A through recombination of electrons and holes. This light is reflected repeatedly on a pair of the edge surfaces of the resonator, and thereafter is outputted as a laser beam at a predetermined wavelength from the one edge surface. In such a manner, the laser oscillation is carried out.

(1-3. Workings and Effects)

As mentioned above, in the semiconductor light-emitting device, an increase in the composition ratio of the In in the active layer achieves emission of light at the green wavelength; however, a difference in the lattice constant between the active layer and the foundation layer increases, leading to an increased lattice distortion of a crystal in association with such an increase in the difference. Further, an issue of deterioration in light-emitting efficiency has occurred due to degradation in crystalline property that is caused by proliferation of crystal defects such as dislocation in the active layer.

The increased lattice distortion is suppressed by configuring the active layer with the quantum dots. Further, the quantum structure (the quantum dot structure) that is configured with the quantum dots makes it possible to reduce extra charges that make no contribution to the laser oscillation, and to generate an optical gain efficiently. Considerations have been given to a variety of methods of forming the quantum dot structure; however, for example, an MBE (Molecular Beam Epitaxy) method has raised issues of difficulties in high-volume production and stable manufacturing.

In contrast, in the present embodiment, the plurality of first island-shaped regions 13A including $In_bGa_{1-b}N$ are formed inside the $In_aGa_{1-a}N$ layer 13B that determines an outline of the light-emitting layer 13. This allows for reduction in the lattice distortion of the light-emitting layer 13, as compared with a case where the light-emitting layer is formed in a layer shape at a composition ratio identical to that of the island-shaped region 13A. The reduced lattice distortion of the light-emitting layer 13 leads to a decrease in the piezoelectric field caused by the lattice distortion. As a result, this makes it possible to improve PL (Photo Luminescence) intensity and light-emitting efficiency.

As described above, it is possible to form the light-emitting layer 13 with such a configuration through the In desorption from the $In_xGa_{1-x}N$ layer 13C. The In desorption from the $In_xGa_{1-x}N$ layer 13C is achievable by exposing the $In_xGa_{1-x}N$ layer 13C under a high-temperature condition. The degree or velocity of the In desorption from the $In_xGa_{1-x}N$ layer 13C is controllable by adjusting, for example, temperature, a thickness of the cap layer 14 to be provided on a front surface of the $In_xGa_{1-x}N$ layer 13C, a type of gas promoting the In desorption, etc. as appropriate. In such a manner, it is possible to form the plurality of first island-shaped regions 13A with use of an easy-to-control In desorption method. Further, use of the MOCVD method suitable for the high-volume production makes it possible to form the $In_xGa_{1-x}N$ layer 13C and the cap layer 14.

As described above, in the present embodiment, it is possible to simply and stably manufacture the semiconductor laser 1 that allow for improvement in light-emitting efficiency.

Further, in the laser that typically uses the quantum dots, it is necessary for a size of the quantum dot to be several nm in expectation of quantization by confinement of wave functions of electrons and holes in an in-plane direction. Additionally, it is desired to uniform sizes to equalize quantum levels in respective dots. In contrast, in the present embodiment, a layer serving as a substantial active layer that includes $In_bGa_{1-b}N$ having the high In composition is provided as the plurality of island-shaped regions (the island-shaped regions 13A). This achieves a high-quality active layer with reduced lattice distortion. Therefore, even if sizes (for example, widths) of the respective island-shaped regions 13A in plane are non-uniform, and too large to have a quantum effect, it is possible to achieve the effects similar to those obtained in a case where the quantum dots are used.

Next, description is provided on a semiconductor laser according to another embodiment of the present disclosure. Hereinafter, any component parts essentially same as those in the semiconductor laser 1 according to the above-described first embodiment are denoted with same reference numerals, and description thereof is omitted as appropriate.

[2. Second Embodiment]

FIG. 7 illustrates an example of a configuration of a semiconductor laser (a semiconductor laser 2) according to a second embodiment of the present disclosure. The semiconductor laser 2 is, for example, an edge-emitting semiconductor laser, as with the semiconductor laser 1 according to the above-described first embodiment. The semiconductor laser 2 is, for example, a nitride-based semiconductor laser that oscillates a laser beam at a green wavelength band, and is different from the semiconductor laser 1 according to the above-described first embodiment in that the semiconductor laser 2 has a plurality of light-emitting layers (here, a two-layered structure; the light-emitting layer 13 and a light-emitting layer 22). It is to be noted that FIG. 7 schematically illustrates a configuration of the semiconductor laser 2, and illustrated dimensions and shape thereof are different from actual ones.

The semiconductor laser 2 has the light-emitting layer 22 at a position farther away from the substrate 10 than the light-emitting layer 13. Specifically, the semiconductor laser 2 has a barrier layer 21, the light-emitting layer 22, and a cap layer 23 between the cap layer 14 and the guide layer 15 in this order from the substrate 10 side. It is to be noted that, in a case where the cap layer 14 is omitted, the semiconductor laser 2 has the barrier layer 21 and the light-emitting layer 22 between the light-emitting layer 13 and the guide layer 15 in this order from the substrate 10 side, as illustrated in FIG. 8, for example. The barrier layer 21 includes, for example, an $Al_cIn_dGa_{1-(c+d)}N$ (c≥0, d≥0). As a specific material for the barrier layer 21, the barrier layer 21 includes a material with a large bandgap, e.g. GaN, InGaN, AlGaN, and AlInGaN, and a thickness thereof is, for example, from 1 nm to 20 nm both inclusive.

The light-emitting layer 22 has an $In_eGa_{1-e}N$ layer 22B (e≥0), and a plurality of island-shaped regions 22A including $In_fGa_{1-f}N$ (f>e) inside the $In_eGa_{1-e}N$ layer 22B. In other words, the light-emitting layer 22 has, in its layer, a plurality of regions (the plurality of island-shaped regions 22A and the $In_eGa_{1-e}N$ layer 22B) that are different from one another in In concentration. Each of the island-shaped regions 22A is relatively higher in the In concentration as compared with the $In_eGa_{1-e}N$ layer 22B. The $In_eGa_{1-e}N$ layer 22B is relatively lower in the In concentration as compared with each of the island-shaped regions 22A. It is to be noted that the light-emitting layer 22 may include other additive elements of In, Ga, and N, as with the case of the light-emitting layer 13. Examples of the additive elements include aluminum (Al), boron (B), and thallium (Tl).

Each of a bottom surface and a top surface of the light-emitting layer 22 takes a convexo-concave shape in conformity to a convexo-concave shape of each of top surfaces of the bottom cladding layer 11 and the guide layer 12, for example. Typically, the top surfaces of the bottom cladding layer 11 and the guide layer 12 are flat surfaces, and accordingly the bottom surface and the top surface of the light-emitting layer 22 are also flat surfaces. In other words, both of the bottom surface and the top surface of the $In_eGa_{1-e}N$ layer 22B are flat surfaces, and do not take the shape in conformity to the convexo-concave shape formed by the plurality of island-shaped regions 22A. Each of the island-shaped regions 22A is provided in an island-shaped manner at the bottom (here, on the guide layer 12 side) of the light-emitting layer 22, and a region extending from side surfaces to a top surface of each of the island-shaped regions 22A is covered with the $In_eGa_{1-e}N$ layer 22B. Therefore, the $In_eGa_{1-e}N$ layer 22B determines an outline of the light-emitting layer 22, and the plurality of island-shaped regions 22A are formed inside the $In_eGa_{1-e}N$ layer 22B that determines the outline of the light-emitting layer 22. As with formation of the light-emitting layer 13 through In desorption from the $In_xGa_{1-x}N$ layer in the above-described first embodiment, it is possible to form the light-emitting layer 22 with such a configuration through In desorption from the $In_yGa_{1-y}N$ layer (y>0).

Here, a residual ratio (R) of the plurality of island-shaped regions 22A in the light-emitting layer 22 is 80% or less. As a result of the In desorption from the $In_yGa_{1-y}N$ layer, the residual ratio (R) becomes 80% or less, leading to formation of the plurality of island-shaped regions 22A.

The cap layer 23 includes, for example, undoped or p-type AlGaN that is represented by $Al_iIn_jGa_{1-(i+j)}N$ (i≥0, j≥0), and adjusts the In desorption from the $In_yGa_{1-y}N$ layer (y>0) during a waiting time in a manufacturing process. A film thickness (hereinafter simply referred to as a thickness) of the cap layer 23 in a lamination direction may be, for example, 2 nm or less, and is preferably, for example, from 0.1 nm to 1 nm both inclusive in consideration of manufacturing efficiency and easy control of the In desorption.

It is to be noted that use of the manufacturing process similar to that of the above-described semiconductor laser 1 makes it possible to manufacture the semiconductor laser 2. First, the light-emitting layer 13 having the plurality of island-shaped regions 13A is formed using a method similar to that for the semiconductor laser 1, and thereafter the barrier layer 21 that includes the $Al_cIn_dGa_{1-(c+d)}N$ (c≥0, d≥0), the $In_yGa_{1-y}N$ layer, and the cap layer 23 are formed in this order on the cap layer 14. It is to be noted that the cap layer 23 has a thickness ensuring that the residual ratio of the plurality of island-shaped regions 22A in the light-emitting layer 22 is 80% or less by waiting for a predetermined time period. Next, In is desorbed from the $In_yGa_{1-y}N$ layer through the cap layer 23 by waiting for a predetermined time period. Through the In desorption from the $In_yGa_{1-y}N$ layer, the light-emitting layer 22 having the plurality of island-shaped regions 22A that include $In_fGa_{1-f}N$ (f>e) is formed in the $In_eGa_{1-e}N$ layer 22B. Subsequently, the guide layer 15, the top cladding layer 16, the contact layer 18, the current constriction layer 17, and the top electrode 19 are formed using the method similar to that for the semiconductor laser 1. Thus, the semiconductor laser 2 of the present embodiment is completed.

FIG. 9A illustrates configurations of the light-emitting layer 13 and the light-emitting layer 22 of the present embodiment (a working example). The residual ratio (R) of the plurality of island-shaped regions 22A in the light-emitting layer 22 is 80% or less, which is greater than the residual ratio (R) of the plurality of island-shaped regions 13A in the light-emitting layer 13.

FIG. 9B illustrates configurations of a light-emitting layer 113 and a light-emitting layer 122 according to a comparative example (a comparative example 1). In the comparative example 1, the light-emitting layer 113 is provided at a position corresponding to the light-emitting layer 13 of the present embodiment, and the light-emitting layer 122 is provided at a position corresponding to the light-emitting layer 22 of the present embodiment. The light-emitting layer 113 has an $In_kGa_{1-k}N$ layer 113B (k≥0), and a plurality of island-shaped regions 113A including $In_lGa_{1-l}N$ (l>k) inside the $In_kGa_{1-k}N$ layer 113B. Further, the light-emitting layer 122 includes a single layer including InGaN. The comparative example 1 differs from the present embodiment in that the light-emitting layer 122 on an upper side includes a single layer including InGaN.

FIG. 9C illustrates configurations of a light-emitting layer 114 and a light-emitting layer 122 according to a comparative example (a comparative example 2). In the comparative example 2, the light-emitting layer 114 is provided at a position corresponding to the light-emitting layer 13 of the present embodiment, and the light-emitting layer 122 is provided at a position corresponding to the light-emitting layer 22 of the present embodiment. Each of the light-emitting layer 114 and the light-emitting layer 122 includes a single layer including InGaN. The comparative example 2 differs from the present embodiment in that each of the light-emitting layer 114 and the light-emitting layer 122 includes a single layer including InGaN.

FIG. 10 illustrates emission intensity at each PL wavelength in the semiconductor laser having the light-emitting layers 13 and 22 illustrated in FIG. 9A (the working example), and the semiconductor laser having the light-emitting layers 114 and 122 illustrated in FIG. 9C (the comparative example 2). FIG. 11 illustrates emission intensity at each average PL wavelength in the semiconductor laser having the light-emitting layers 113 and 122 illustrated in FIG. 9B (the comparative example 1), and the semiconductor laser having the light-emitting layers 114 and 122 illustrated in FIG. 9C (the comparative example 2). As seen from FIG. 9 and FIG. 10, the highest emission intensity is achieved as found in the working example in a case where the island-shaped InGaN regions (the island-shaped regions 13A and 22A) having a high In composition ratio are provided on both of the two layers, and further the residual ratio of the plurality of island-shaped regions 22A in the light-emitting layer 22 on an upper side is greater than the residual ratio of the plurality of island-shaped regions 13A in the light-emitting layer 13 on a lower side.

As found in the present embodiment, in a case where two light-emitting layers (the light-emitting layer 13 and the light-emitting layer 22) are laminated, the plurality of island-shaped regions 22A having a relatively high In concentration are preferably provided also within the light-emitting layer 22 on the upper side. In addition, preferably, the residual ratio (R) of the plurality of island-shaped regions 22A in the light-emitting layer on the upper side (the light-emitting layer 22) is 80% or less, and further is greater than the residual ratio (R) of the plurality of island-shaped regions 13A in the light-emitting layer on the lower side (the light-emitting layer 13). In such a manner, the residual ratio (R) on the upper side is increased while decreasing the residual ratio (R) on the lower side, which makes it possible to achieve higher emission intensity, while reducing an amount of strain exerted on a first region 22a on the upper layer side.

It is to be noted that the three or more light-emitting layers of the semiconductor laser may be laminated, as illustrated in FIG. 12 and FIG. 13, for example. Even in this case, it is preferable that each of the light-emitting layers (the light-emitting layer 13, the light-emitting layer 22, and a light-emitting layer 25 in FIG. 12 and FIG. 13) have an $In_mGa_{1-m}N$ layer (m≥0), and have a plurality of island-shaped regions including $In_nGa_{1-n}N$ (n>m) inside the $In_mGa_{1-m}N$ layer. Further, it is also preferable that the residual ratios (R) of the respective light-emitting layers (the light-emitting layer 13, the light-emitting layer 22, and the light-emitting layer 25 in FIG. 12 and FIG. 13) be 80% or less, and become smaller gradually from the light-emitting layer on the upper side to the light-emitting layer on the lower side, that is, in order of the light-emitting layers 25, 22, and 13.

The light-emitting layer 25 has an $In_pGa_{1-p}N$ layer 25B (p≥0), and has a plurality of island-shaped regions 25A including $In_qGa_{1-q}N$ (q>p) inside the $In_pGa_{1-p}N$ layer 25B. A cap layer 26 that includes a material similar to that used for the cap layer 14 is provided. It is to be noted that the cap layer 26 may be omitted.

It is to be noted that, in the semiconductor laser in which the three or more light-emitting layers are laminated as illustrated in FIG. 12 and FIG. 13, the residual ratio of the island-shaped regions in an uppermost light-emitting layer is not necessarily 80% or less, and the residual ratio exceeding 80% may be permitted, or the island-shaped regions may be provided in layers. Forming the island-shaped regions at least in the light-emitting layer below the uppermost light-emitting layer makes it possible to reduce an amount of strain exerted on the light-emitting layer (the light-emitting region) on the upper side, thereby allowing for improvement in emission intensity.

The present disclosure is described thus far with reference to the first and second embodiments; however, the present disclosure is not limited to the above-described embodiments, but various modifications may be made. For example, in the above-described respective embodiments and the modification examples thereof, the substrate 10 may be an insulating substrate such as a sapphire substrate. In such a case, however, the bottom electrode 30 is preferably formed in contact with the bottom cladding layer 11 or the guide layer 12.

Further, the effects mentioned in the above-described embodiments, etc. are merely exemplified. The effects of the present disclosure may be other effects, or may further include other effects.

It is to be noted that the present disclosure may have the following configurations.

(1)
A semiconductor light-emitting device including:
a nitride-based first light-emitting layer, in which
the first light-emitting layer has an $In_aGa_{1-a}N$ layer (a≥0), and has a plurality of first island-shaped regions that include $In_bGa_{1-b}N$ (b>a) inside the $In_aGa_{1-a}N$ layer.

(2)
The semiconductor light-emitting device according to (1), in which
the first light-emitting layer is formed through In desorption from an $In_xGa_{1-x}N$ layer (x>0), and
a residual ratio of the plurality of first island-shaped regions in the first light-emitting layer is 80% or less.

(3)
The semiconductor light-emitting device according to (2), further including:
a barrier layer in contact with a top surface of the first light-emitting layer; and
a second light-emitting layer in contact with a top surface of the barrier layer,
in which the barrier layer includes $Al_cIn_dGa_{1-(c+d)}N$ (c≥0, d≥0), and
the second light-emitting layer has an $In_eGa_{1-e}N$ layer (e≥0), and has a plurality of second island-shaped regions including $In_fGa_{1-f}N$ (f>e) inside the $In_eGa_{1-e}N$ layer.

(4)
The semiconductor light-emitting device according to (3), in which
the second light-emitting layer is formed through In desorption from an $In_yGa_{1-y}N$ layer (y>0), and
a residual ratio of the plurality of second island-shaped regions in the second light-emitting layer is 80% or less.

(5)
The semiconductor light-emitting device according to (3) or (4), in which a residual ratio of the plurality of second island-shaped regions in the second light-emitting layer is greater than the residual ratio of the plurality of first island-shaped regions in the first light-emitting layer.

(6)
The semiconductor light-emitting device according to any one of (1) to (5), in which
a first cap layer in contact with a top surface of the first light-emitting layer is included, and
the first cap layer has a thickness of 0.1 nm to 1 nm both inclusive, and includes $Al_gIn_hGa_{1-(g+h)}N$ (g≥0, h≥0).

(7)
The semiconductor light-emitting device according to (6), further including:
a barrier layer in contact with a top surface of the first cap layer; and
a second light-emitting layer in contact with a top surface of the barrier layer,
in which the barrier layer includes $Al_cIn_dGa_{1-(c+d)}N$ (c≥0, d≥0), and
the second light-emitting layer has an $In_eGa_{1-e}N$ layer (e≥0), and has a plurality of second island-shaped regions including $In_fGa_{1-f}N$ (f>e) inside the $In_eGa_{1-e}N$ layer.

(8)
The semiconductor light-emitting device according to (7), in which
the second light-emitting layer is formed through In desorption from an $In_yGa_{1-y}N$ layer (y>0), and
a residual ratio of the plurality of second island-shaped regions in the second light-emitting layer is 80% or less.

(9)
The semiconductor light-emitting device according to (7) or (8), in which a residual ratio of the plurality of second island-shaped regions in the second light-emitting layer is greater than a residual ratio of the plurality of first island-shaped regions in the first light-emitting layer.

(10)
The semiconductor light-emitting device according to any one of (3) to (9), in which
a second cap layer in contact with a top surface of the second light-emitting layer is included, and
the second cap layer has a thickness of 0.1 nm to 1 nm both inclusive, and includes $Al_iIn_jGa_{1-(i+j)}N$ (i≥0, j≥0).

(11)
The semiconductor light-emitting device according to any one of (3) to (10), in which each of the first light-emitting layer and the second light-emitting layer further includes an additive element.

(12)
The semiconductor light-emitting device according to (11), in which the additive element is one or more kinds of aluminum (Al), boron (B), and thallium (Tl).

(13)
A method of manufacturing a semiconductor light-emitting device, the method including:
forming, through In desorption from an $In_xGa_{1-x}N$ layer (x>0), a nitride-based first light-emitting layer having an $In_aGa_{1-a}N$ layer (a≥0) and having a plurality of first island-shaped regions that include $In_bGa_{1-b}N$ (b>a) inside the $In_aGa_{1-a}N$ layer.

(14)
The method of manufacturing the semiconductor light-emitting device according to (13), in which In is desorbed from the $In_xGa_{1-x}N$ layer by waiting for a predetermined time period after forming the $In_xGa_{1-x}N$ layer using an MOCVD (Metal-Organic Chemical Vapor Deposition) method.

(15)
The method of manufacturing the semiconductor light-emitting device according to (13), in which the $In_xGa_{1-x}N$ layer and a first cap layer including $Al_gIn_hGa_{1-(g+h)}N$ (g≥0, h≥0) are formed in this order using an MOCVD (Metal-Organic Chemical Vapor Deposition) method, and thereafter, In is desorbed from the $In_xGa_{1-x}N$ layer through the first cap layer by waiting for a predetermined time period.

(16)
The method of manufacturing the semiconductor light-emitting device according to (15), in which the first cap layer has a thickness ensuring that a residual ratio of the plurality of first island-shaped regions in the first light-emitting layer is 80% or less by waiting for the predetermined time period.

(17)
The method of manufacturing the semiconductor light-emitting device according to (15) or (16), in which a barrier layer including $Al_cIn_dGa_{1-(c+d)}N$ (c≥0, d≥0), an $In_yGa_{1-y}N$ layer (y>0), and a second cap layer including $Al_iIn_jGa_{1-(i+j)}N$ (i≥0, j≥0) are formed in this order on the first cap layer using an MOCVD method, and thereafter In is desorbed from the $In_yGa_{1-y}N$ layer through the second cap layer by waiting for a predetermined time period, thereby resultantly forming a nitride-based second light-emitting layer having an $In_eGa_{1-e}N$ layer (e≥0) and having a plurality of island-shaped regions that include $In_fGa_{1-f}N$ (f≥e) inside the $In_eGa_{1-e}N$ layer.

(18)
The method of manufacturing the semiconductor light-emitting device according to (17), in which the second cap layer has a thickness ensuring that a residual ratio of the plurality of second island-shaped regions in the second light-emitting layer is 80% or less by waiting for the predetermined time period.

(19)

The method of manufacturing the semiconductor light-emitting device according to (17) or (18), in which the first light-emitting layer and the second light-emitting layer each of which further includes an additive element are formed.

(20)

The method of manufacturing the semiconductor light-emitting device according to (19), in which the additive element is one or more kinds of aluminum (Al), boron (B), and thallium (Tl).

It should be understood that various changes and modification to the presently preferred embodiment described herein will be apparent to those skilled in the art. Such changes and modifications can be made without departing from the spirit and scope of the present subject matter and without diminishing its intended advantages. It is therefor intended that such changes and modifications be covered by the appended claims.

The invention claimed is:

1. A semiconductor light-emitting device comprising:
a nitride-based first light-emitting layer, wherein the first light-emitting layer has an $In_aGa_{1-a}N$ layer (a $\geq$0), and has a plurality of first island-shaped regions that include $In_bGa_{1-a}N$ (b>a) inside the $In_aGa_{1-a}N$ layer;
wherein the first light-emitting layer is formed through In desorption from an $In_xGa_{1-x}N$ layer (x>0);
wherein a residual ratio of the plurality of first island-shaped regions in the first light-emitting layer is 80% or less;
wherein a barrier layer is in contact with a top surface of the first light-emitting layer;
wherein a second light-emitting layer is in contact with a top surface of the barrier layer;
wherein the barrier layer includes $Al_cIn_dGa_{1-(c+d)}N$ (c>0, d>0); and
wherein the second light-emitting layer has an $In_eGa_{1-e}N$ layer (e>0), and has a plurality of second island-shaped regions including $In_fGa_{1-f}N$ (f>e) inside the $In_eGa_{1-e}N$ layer.

2. The semiconductor light-emitting device according to claim 1, wherein
the second light-emitting layer is formed through In desorption from an $In_yGa_{1-y}N$ layer (y>0), and
a residual ratio of the plurality of second island-shaped regions in the second light-emitting layer is 80% or less.

3. The semiconductor light-emitting device according to claim 1, wherein a residual ratio of the plurality of second island-shaped regions in the second light-emitting layer is greater than the residual ratio of the plurality of first island-shaped regions in the first light-emitting layer.

4. The semiconductor light-emitting device according to claim 1, wherein
a first cap layer in contact with a top surface of the first light-emitting layer is included, and
the first cap layer has a thickness of 0.1 nm to 1 nm both inclusive, and includes $Al_gIn_hGa_{1-(g+h)}N$ (g$\geq$0, h$\geq$0).

5. The semiconductor light-emitting device according to claim 4, further comprising:
a barrier layer in contact with a top surface of the first cap layer; and
a second light-emitting layer in contact with a top surface of the barrier layer,
wherein the barrier layer includes $Al_cIn_dGa_{1-(c+d)}N$ (c$\geq$0, d$\geq$0), and
the second light-emitting layer has an $In_eGa_{1-e}N$ layer (e$\geq$0), and has a plurality of second island-shaped regions including $In_fGa_{1-f}N$ (f$\geq$e) inside the $In_eGa_{1-e}N$ layer.

6. The semiconductor light-emitting device according to claim 5, wherein
the second light-emitting layer is formed through In desorption from an $In_yGa_{1-y}N$ layer (y>0), and
a residual ratio of the plurality of second island-shaped regions in the second light-emitting layer is 80% or less.

7. The semiconductor light-emitting device according to claim 5, wherein a residual ratio of the plurality of second island-shaped regions in the second light-emitting layer is greater than a residual ratio of the plurality of first island-shaped regions in the first light-emitting layer.

8. The semiconductor light-emitting device according to claim 1, wherein
a second cap layer in contact with a top surface of the second light-emitting layer is included, and
the second cap layer has a thickness of 0.1 nm to 1 nm both inclusive, and includes $Al_iIn_jGa_{1-(i+j)}N$ (i$\geq$0, j$\geq$0).

9. The semiconductor light-emitting device according to claim 1, wherein each of the first light-emitting layer and the second light-emitting layer further includes an additive element.

10. The semiconductor light-emitting device according to claim 9, wherein the additive element is one or more kinds of aluminum (Al), boron (B), and thallium (Tl).

11. A semiconductor light-emitting device comprising:
a nitride-based first light-emitting layer, wherein the first light-emitting layer has an $In_aGa_{1-a}N$ layer (a$\geq$0), and has a plurality of first island-shaped regions that include $In_bGa_{1-b}N$ (b>a) inside the $In_aGa_{1-a}N$ layer;
wherein a first cap layer in contact with a top surface of the first light-emitting layer is included, and the first cap layer has a thickness of 0.1 nm to 1 nm both inclusive, and includes $Al_gIn_hGa_{1-(g+h)}N$ (g$\geq$0, h$\geq$0);
wherein a barrier layer is in contact with a top surface of the first cap layer;
wherein a second light-emitting layer is in contact with a top surface of the barrier layer;
wherein the barrier layer includes $Al_cIn_dGa_{1-(c+d)}N$ (c$\geq$0, d$\geq$0); and
wherein the second light-emitting layer has an $In_eGa_{1-e}N$ layer (e>0), and has a plurality of second island-shaped regions including $In_fGa_{1-f}N$ (f$\geq$e) inside the $In_eGa_{1-e}N$ layer.

12. The semiconductor light-emitting device according to claim 11, wherein the second light-emitting layer is formed through In desorption from an $In_yGa_{1-y}N$ layer (y>0), and
wherein a residual ratio of the plurality of second island-shaped regions in the second light-emitting layer is 80% or less.

13. The semiconductor light-emitting device according to claim 11, wherein a residual ratio of the plurality of second island-shaped regions in the second light-emitting layer is greater than a residual ratio of the plurality of first island-shaped regions in the first light-emitting layer.

* * * * *